United States Patent [19]

Ohmura

[11] 4,385,937
[45] May 31, 1983

[54] REGROWING SELECTIVELY FORMED ION AMORPHOSIZED REGIONS BY THERMAL GRADIENT

[75] Inventor: Yamichi Ohmura, Sagamihara, Japan

[73] Assignee: Tokyo Shibaura Denki Kabushiki Kaisha, Kawasaki, Japan

[21] Appl. No.: 263,502

[22] Filed: May 14, 1981

[30] Foreign Application Priority Data

May 20, 1980 [JP] Japan .................................. 55-65897
Oct. 16, 1980 [JP] Japan ................................ 55-143625

[51] Int. Cl.$^3$ .................. H07L 21/263; H07L 21/225
[52] U.S. Cl. .................................. 148/1.5; 29/576 B; 148/175; 148/187; 357/2; 357/59; 357/91
[58] Field of Search .................. 148/1.5, 187, 175; 357/2, 59, 91; 29/576 B

[56] References Cited

U.S. PATENT DOCUMENTS 4,177,084  12/1979  Lau et al. ............................. 148/1.5
4,261,762  4/1981   King .................................... 148/1.5
4,309,225  1/1982   Fan et al. ............................ 148/1.5

FOREIGN PATENT DOCUMENTS 54-161268 12/1979 Japan .

OTHER PUBLICATIONS

Fang et al., IBM-TDB, 22, (1979), 1236.
Csepregi et al., J. Appl. Phys. 49, (1978), 3906.
Fang et al., IBM-TDB, 23, (Jun. 1980), 362.
"Laser Annealing of Silicon on Saphire" by M. E. Roulet et al., Journal of Applied Physics, vol. 50, #8, Aug. 1979, pp. 536-538.
Dynamics of Nd:YAG Laser Annealing of Silicon on Saphire by W. Luthy et al., Applied Physics Letters, vol. 35, #11, Dec. 1, 1979, pp. 873-875.

*Primary Examiner*—Upendra Roy
*Attorney, Agent, or Firm*—Oblon, Fisher, Spivak, McClelland & Maier

[57] ABSTRACT

Processes for forming a wafer having SOS structure are provided. A single crystal silicon layer is formed on a principal plane of a sapphire substrate. An amorphous portion is formed in a silicon layer leaving its surface portion of predetermined depth as it is and by injecting Si+ into the single crystal silicon layer. This amorphous portion reaches the interface of sapphire substrate. A wafer thus formed is placed on a cooling table in a furnace. The substrate is fixedly bonded onto the cooling table with indium and cooled to a predetermined temperature. A temperature higher than that applied to the sapphire substrate is applied to the silicon layer including the amorphous portion using a heater arranged in the furnace and $N_2$ gas flowing into the furnace. The SOS wafer is then returned to room temperature.

13 Claims, 22 Drawing Figures

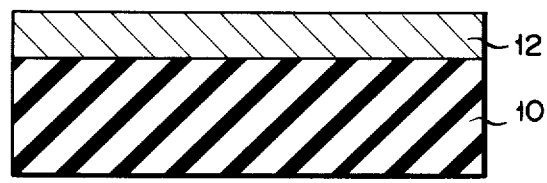
F I G. 1A
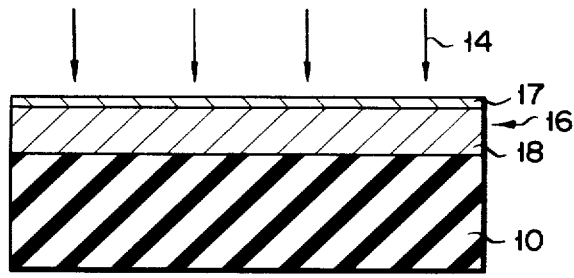
F I G. 1B
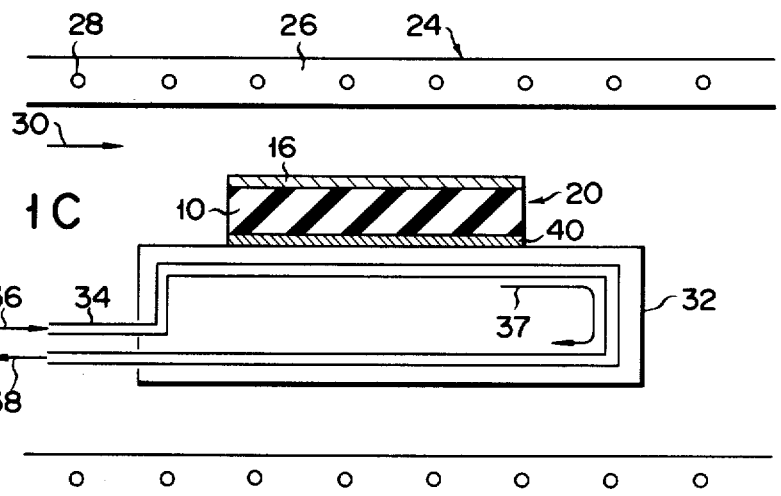
F I G. 1C
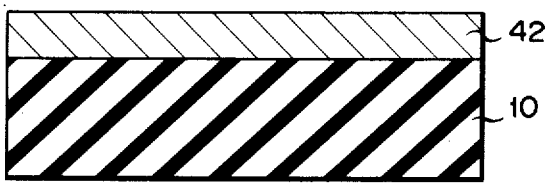
F I G. 1D

REGROWING SELECTIVELY FORMED ION AMORPHOSIZED REGIONS BY THERMAL GRADIENT

BACKGROUND OF THE INVENTION

1. Field of the Invention

The present invention relates to a method for manufacturing a semiconductor device and, more particularly, a method for manufacturing a semiconductor device having predetermined semiconductor elements on an insulating substrate.

2. Description of the Prior Art

The conventional method for manufacturing a semiconductor device having predetermined semiconductor elements on the insulating substrate or a silicon-on-sapphire device (which will be hereinafter referred to as SOS device) in which silicon semiconductor elements are formed on the sapphire substrate includes a process of depositing a silicon single crystal layer on the sapphire substrate, a process of transforming a desired region of silicon single crystal layer to an amorphous construction, and a process of heating the silicon single crystal layer of amorphous structure to 900° C. or 1000° C. and regrowing it. After the completion of these processes, predetermined elements or MOS transistors, for example, are formed in the silicon single crystal layer.

However, the hole mobility of SOS thus formed according to the conventional method is not changed, but the electron mobility thereof is reduced. The field-effect mobility $\mu_{fe}$ of N-channel MOS transistor formed on (100) plane of P-type bulk Si having an acceptor concentration of about $5 \times 10^{16}$ cm$^{-3}$, for example, ranges from 900 cm$^2$/V·sec to 1,000 cm$^2$/V·sec, while that of N-channel MOS transistor formed on the SOS including a silicon single crystal layer whose thickness ranges from 0.7 μm to 1 μm is only about 600 cm$^2$/V·sec.

To explain the reason why the above-mentioned drawback is caused, sapphire employed as the insulating substrate has a thermal expansion coefficient two time larger than that of silicon, and when the SOS is returned to room temperature after the finish of its growth process, the sapphire substrate has more of a contraction than the silicon layer. Therefore, the silicon layer is effected by compressive stress acting toward the principal plane thereof when the sapphire substrate contracts, thus causing compressive strain. The lower end of conduction band in the energy band structure of silicon is present in a direction of the main axis of the wave-vector space i.e. of [100] axis, and the equal-energy plane of electrons adjacent to this region is an ellipsoid of revolution taking the main axis direction as its longitudinal axis. Therefore, when under normal condition or no compressive stress is applied, no anisotropy appears in the electron mobility. However, when compressive strain is caused because of contraction of sapphire substrate in the principal plane or XY plane of silicon layer, the energy of the ellipsoid of revolution in the K$_z$ direction i.e. equal-energy plane becomes higher than those of the equal-energy planes in K$_x$ and K$_y$ directions. Therefore, electrons in the K$_z$ valley move to the K$_x$ and K$_y$ valleys, so that the electron mobility in the principal plane of silicon layer depends on increased electrons in K$_x$ and K$_y$ valleys, which have comparatively large mass, and is thus reduced.

SUMMARY OF THE INVENTION

The object of the present invention is to provide a method for manufacturing a semiconductor device in which active elements formed on an insulating substrate have a large electron mobility.

The semiconductor device manufacturing method of the present invention comprises a first process of forming a single crystal semiconductor layer on a first crystal plane of an insulating substrate which has a first thermal expansion rate, said single crystal semiconductor layer having a second thermal expansion rate and a second crystal plane as its principal plane; a second process of injecting selected ions into a desired region of single crystal semiconductor layer and transforming it to an amorphous portion; and a third process of regrowing the amorphous portion formed by the second process keeping the single crystal semiconductor layer and amorphous portion at a first temperature while keeping the insulating substrate at a second temperature lower than the first temperature. Therefore, the thermal expansion of insulating substrate is suppressed during the regrowth of amorphous layer, so that the single crystal semiconductor layer on the insulating substrate when returned to room temperature can be decreased in or prevented from having compressive stress acting in a direction of its principal plane but can have tensile stress acting in the direction of its principal plane, thus allowing the electron mobility in the single crystal semiconductor layer to be extremely enhanced.

BRIEF DESCRIPTION OF THE DRAWINGS

FIGS. 1A to 1D show in schematic cross-sections some of major processes in a first embodiment of semiconductor device manufacturing method according to the present invention.

DETAILED DESCRIPTION OF THE PREFERRED EMBODIMENTS

Figure 2:
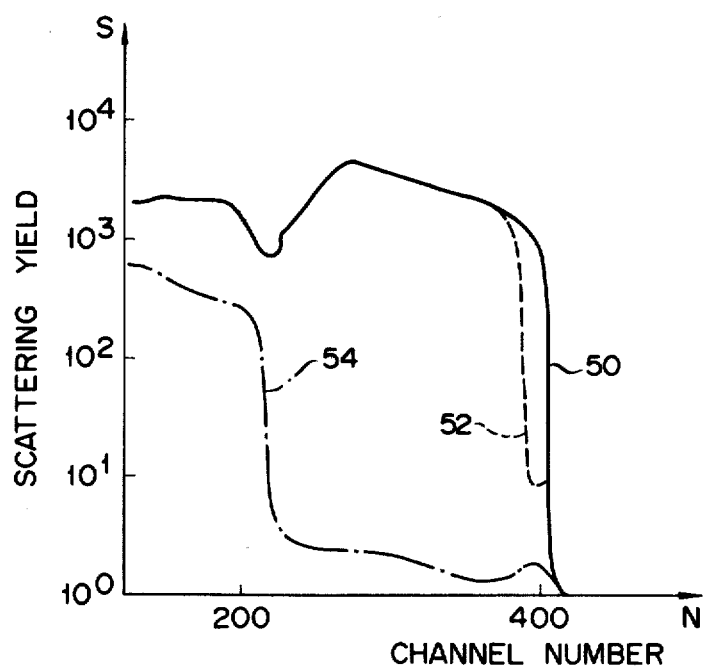
FIG. 2 is a graph showing the helium backscattering yield of a semiconductor device manufactured according to processes shown in FIG. 1.

FIGS. 1A to 1D show schematic cross sections of a semiconductor manufactured according to a first embodiment of manufacturing method of the present invention. In FIG. 1A, an insulating substrate, for example sapphire substrate 10 is polished to have a thickness of about 320 μm. (ī012) crystal plane, for example, is selected as the principal plane of the sapphire substrate 10. A silicon single crystal layer 12 having a thickness of 0.7 μm, for example, is formed on the principal plane of sapphire substrate 10. The silicon single crystal layer 12 is epitaxially grown by thermo-decomposing silane (SiH₄) which has been diluted by hydrogen (H₂) in an atmosphere of 950° C., for example. Therefore, this silicon single crystal layer 12 has the (100) principal plane.

As shown in FIG. 1B, SOS wafer formed in FIG. 1A is held lower than 20° C. while silicon ions (Si+) 14, for example, are implanted into all area of silicon single crystal layer 12. This Si+implantation is carried out by successively accelerating its implantation energy to 140 KeV, 250 KeV, 400 KeV, 550 KeV and 700 KeV, and Si+implantation dose at each implantation energy is set $1 \times 10^{15}$ cm$^{-2}$, for example. As the result, the crystal structure of silicon single crystal layer 12 starts to change to amorphous structure from its boundary region with the sapphire substrate 10. And a silicon layer 16 is changed to have amorphous crystal structure except a single crystal surface portion 17 of predetermined depth which is 300 Å, for example, or at least larger than 20Å, thus forming an amorphous portion 18.

An SOS wafer 20 formed according to the process of FIG. 1B is placed into a furnace 24 as shown in FIG. 1C. A heater 28 is arranged in the outer wall 26 of furnace 24 and nitrogen (N₂) gas, for example, is flowed into the furnace 24 in a direction shown by an arrow 30. A cooling table 32 is arranged in the furnace 24. The cooling table 32 is made of stainless steel and houses a cooling pipe 34 therein. Cooling gas, for example helium (He) gas circulates through the cooling pipe 32 in a direction shown by arrows 36, 37 and 38, and a desired temperature can be set by controlling the concentration of circulating helium gas. After the SOS wafer 20 is bonded onto the cooling table 32 with low melting metal, for example indium 40, N₂ gas is caused to flow into the furnace 24 to keep the inside of furnace 24 at 900° C., for example. The sapphire substrate 10 of SOS wafer 20 bonded onto the cooling table 32 is cooled to lower than 400° C., that is, 300° C., for example, by further circulating He gas through the cooling pipe 34. Furthermore, it is necessary that a region (not shown) adjacent to the interface between amorphous portion 18 and sapphire substrate 10 be held at the inside temperature of the furnace (900°) for approximately 30 minutes. That is, an interface region corresponding to a depth at least larger than 100 Å or 1 μm, for example, from the interface between amorphous portion 18 and sapphire substrate 10. Because the single crystal silicon layer 42 and sapphire substrate 10 are needed to be previously and close-tightly bonded with each other the expansion of single crystal silicon layer 42 may be suppressed by the sapphire substrate 10 when the SOS wafer is returned to room temperature after the finish of heat treatment. It has been found by tests that the amorphous construction is partly left in the single crystal silicon layer 42 even after the finish of process in FIG. 1C when the depth of interface region in the sapphire substrate 10 is set this time smaller than 100 Å. These are the reasons why the inside of SOS wafer 20 bonded onto the cooling table 32 is cooled to 300° C. except the above-mentioned interface region of sapphire substrate 10. As the result, the heat expansion of sapphire substrate 10 is decreased while the amorphous portion 18 of silicon layer 16 heated at 900° C. grows in solid phase epitaxy using as a starting seed the single crystal surface portion 17 left on the surface of amorphous portion 18. In other words, the amorphous portion 18 formed according to the process of FIG. 1B disappears and the silicon layer 16 is transformed in all region thereof reaching the sapphire substrate 10 to the silicon single crystal layer 42 having single crystal structure. The inside temperature of the furnace is selected considering the following fact. Namely, it has been found by tests that the amorphous portion 18 of silicon layer 16 starts to grow in solid phase epitaxy at a temperature higher than 450° C. and is satisfactorily single-crystallized to the extent reaching the sapphire substrate 10 at a temperature higher than 550° C. in the process of FIG. 1C. Therefore, the temperature inside the furnace 24 was set to 900° C. in this embodiment of the present invention.

The formation of silicon single crystal layer 42 can be confirmed by measuring the SOS wafer after the heat treatment of FIG. 1C by means of backscattering spectrum of He ions.

FIG. 2 is a graph showing the relation between channel number N and scattering yield S of SOS wafer resulted from measuring the backscattering spectrum of He ions. The channel number N corresponds to the depth of silicon layer. A curve 50 shows random spectrum distribution before ions are implanted into the silicon single crystal layer 12 in FIG. 1A, a curve 52 after ions are implanted into the silicon layer 16 in FIG. 1B, and a curve 54 after the heat treatment of silicon single crystal 42 in FIG. 1D.

Furthermore, the depth of single crystal surface portion 17 of silicon layer 16 was set to 300 Å in the process of FIG. 1B considering the following fact. When the implantation dose of silicon ions 14 is increased to made the depth of surface portion 17 smaller than 20 Å, the amorphous portion 18 is not single-crystallized even if it is later subject to any kind of heat treatment. It is therefore necessary for the purpose of obtaining the single crystal silicon layer 42 reformed by solid phase growth that the ion implantation dose is set to leave the single crystal surface portion 17 having a depth of at least 20 Å.

When measured, the lattice constant of SOS wafer thus formed and toward the depth of single crystal silicon layer 42 (FIG. 1D) is 5,420 Å, which is smaller than that of usual bulk silicon. According to Raman spectrum measurement, the optical phonon of silicon single crystal layer 42 is 518 cm$^{-1}$, which is smaller than 520.4 cm$^{-1}$ in the case of bulk silicon. It becomes apparent from these measurement results that tensile stress acts on the single crystal silicon layer 42 toward (100) principal plane thereof.

Figure 3:
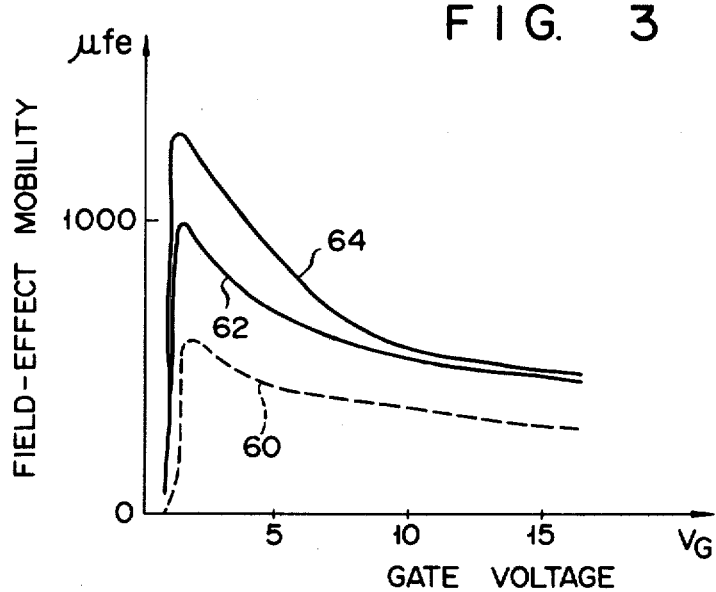
FIG. 3 is a graph showing the relation between gate voltage and field-effect mobility of a semiconductor device manufactured according to processes shown in FIG. 1.

After the finish of processes shown in FIGS. 1A to 1D, the SOS wafer is treated by the well known fabrication technique to form an N-channel MOS transistor thereon. FIG. 3 is a graph showing the change of field-effect mobility $\mu_{fe}$ relative to gate voltage $V_G$ (in volts) of this N-channel MOS transistor. A curve 60 represents the $\mu_{fe}$ change of N-channel MOS transistor formed on the SOS wafer which is conventionally manufactured and the maximum value thereof is about 600 cm²/V·sec. The maximum value of $\mu_{fe}$ of N-channel MOS transistor formed on the usual bulk silicon substrate is about 1,000 cm²/V·sec as apparent from a curve 62. In contrast, the $\mu_{fe}$ of N-channel MOS transistor formed on the SOS wafer which is made according to the manufacturing method of the present invention has the maximum value of 1,200 cm²/V·sec as shown by a curve 64, which is apparently larger than any of other above-mentioned values.

According to the semiconductor device manufacturing method of the present invention as descried above, the sapphire substrate 10 bonded onto the cooling table 32 with low melting metal, for example indium 40 is held 300° C. lower than the inside temperature of furnace when the amorphous portion 18 of silicon layer 16 is heated to 900° C. in the furnace 24 to grow in solid phase. Therefore, the heat expansion of the sapphire substrate 10 which has a heat expansion coefficient larger than that of silicon layer is suppressed. When the heat-treated SOS wafer is returned to room temperature, the contraction rate of sapphire substrate 10 becomes smaller than that of single crystal silicon layer 42 formed on the sapphire substrate 10. Namely, the contraction rate of single crystal silicon layer 42 is larger than that of sapphire substrate 10. Therefore, when the SOS wafer is returned to room temperature, the single crystal silicon layer 42 contracts toward the principal plane thereof to an extent larger than the sapphire substrate 10, so that the single crystal silicon layer 42 can be prevented or refrained from being subject to compressive stress acting toward the principal plane thereof according to the contraction of sapphire substrate 10. The single crystal silicon layer 42 can be effected only by tensile stress corresponding to the difference between contraction rates of single crystal silicon layer 42 and of sapphire substrate 10, thus preventing compressive strain from occurring in the single crystal silicon layer 42 and assisting the occurrence of tensile strain in the single crystal silicon layer 42 corresponding to the tensile stress. Therefore, the electron mobility of single crystal silicon layer 42 formed on the sapphire substrate 10 and acting toward the principal plane thereof can be enhanced substantially. In addition, the operation speed of semiconductor active elements or MOS transistors made according to the well-known manner after the finish of processes which are disclosed by the first embodiment of the present invention can be increased. In the case where active elements are manufactured according to the present invention to have same operation speed as that of active elements of semiconductor device made according to the conventional manner, the extent to which active elements are integrated can be enhanced because the area which active elements of semiconductor device manufactured according to the present invention occupy may be smaller.

Electron mobility can be freely changed by controlling the cooling temperature of sapphire substrate 10 of SOS wafer 20. Namely, the electron mobility of heat-treated single crystal silicon layer 42 acting toward the principal plane thereof can be set to a desired value by controlling the amount of He gas flowing through the cooling pipe 34 provided in the cooling table 32. When it is desired that stress occurring in the single crystal silicon layer 42 is not converted from compressive stress to tensile stress and also it is desired to decrease the strength of compressive stress or to reduce compressive stress to zero in order to bring about a no stress condition, the temperature difference between silicon layer 20 and sapphire substrate 10 may be made smaller by raising the holding temperature of cooling table 32 to a temperature higher than 300° C. or lowering the inside temperature of furnace 24.

Figure 4A:
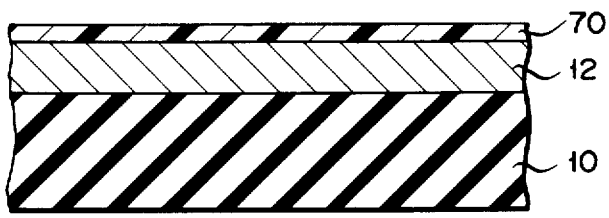
FIGS. 4A to 4D show in schematic cross-sections some of major processes in a second embodiment of semiconductor device manufacturing method according to the present invention.

A second embodiment of semiconductor device manufacturing method according to the present invention will be now described. In FIG. 4A, a mask layer 70 is formed on the single crystal silicon layer 12 formed on the sapphire substrate 10 to have a thickness of 0.5 μm, for example. The mask layer 70 is formed by the well-known chemical vapor deposition (or CVD) process of dioxide silicon ($SiO_2$), for example. The portion of mask layer 70 corresponding to the predetermined area (or open area) in which N-channel elements are to be formed is removed by the process shown in FIG. 4B. The mask layer left is the area in which P-channel elements are to be formed and is called a mask area 74. $Si^+14$ is implanted, as shown in FIG. 4C, into an SOS wafer 75 thus formed. This ion implantation is similar to the one in the first embodiment, particularly shown in FIG. 1B and therefore, detailed description is omitted. As the result of ion implantation, an amorphous portion 76 is formed at a predetermined region in the single crystal silicon layer of open area 72. The amorphous portion 76 is formed, except for the predetermined region (or surface portion) 78, having a depth or thickness of at least over 20 Å or of 300 Å, for example, from the surface of single crystal silicon layer and reaches the interface with the sapphire substrate 10. The mask layer 70 corresponding to the mask area 74 prevents most of $Si^+14$ from being implanted into the single crystal silicon layer 12. However, a portion of the silicon ions 14 permeate the mask layer 70, thus causing another amorphous portion 80 to be formed in the single crystal silicon layer of mask area 74. The surface of amorphous portion 80 is contacted with the mask layer 70. An SOS wafer formed by the process shown in FIG. 4C is heat-treated. Namely, the SOS wafer 82 is placed into the furnace 24 (FIG. 1C) and the silicon layer is heated while the sapphire substrate 10 is held at a temperature lower than the temperature at which the silicon layer is heated. This heat treatment is similar to the one in the first embodiment, particularly shown in FIG. 1C and therefore, detailed description about it is omitted. As the result of heating, amorphous portions 76 and 80 at open and mask areas 72 and 74 are transformed to single crystal structure by so-called solid phase epitaxial regrowth. Therefore, a single crystal silicon layer 86 is formed on the sapphire substrate 10 as shown in FIG. 4D. Numeral 88 represents an SOS wafer thus formed from which the mask layer 70 has been removed by the well-known manner.

It has been found measuring the lattice constant of SOS wafer 88 that the lattice constant toward the depth of heat-treated single crystal silicon layer at the open area 72 is 5.420 Å. It is smaller than the lattice constant of usual bulk silicon and shows therefore that tensile strain is caused in the single crystal silicon layer of open area 72 toward (100) principal plane thereof. It has been found that the lattice constant toward the depth of single crystal silicon layer at the mask area 74 is 5.440 Å, which shows that compressive strain is still caused toward the principal plane of this silicon layer. Therefore, electron mobility at the open area 72 in which N-channel elements using electrons as their carriers are to be formed can be enhanced on the basis of same reasons as described above. Hole mobility at the mask area 74 in which P-channel elements using holes as their carriers are to be formed can also be enhanced because hole mobility becomes larger due to compressive stress toward the principal plane of silicon layer as compared with that of bulk silicon in the case of hole carriers which is reverse to the case of electron carriers.

Figure 4B:
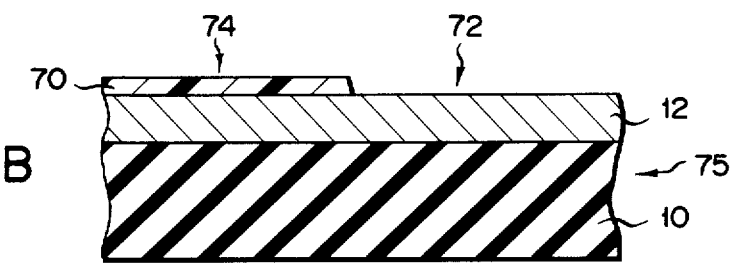
Figure 4C:
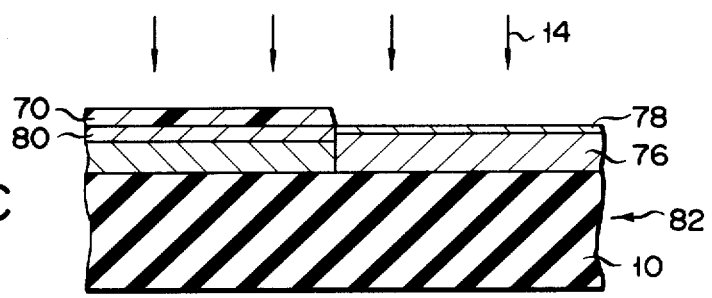
Figure 4D:
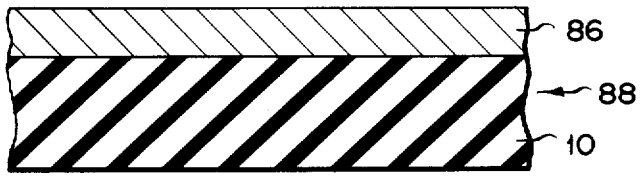
Figure 5A:
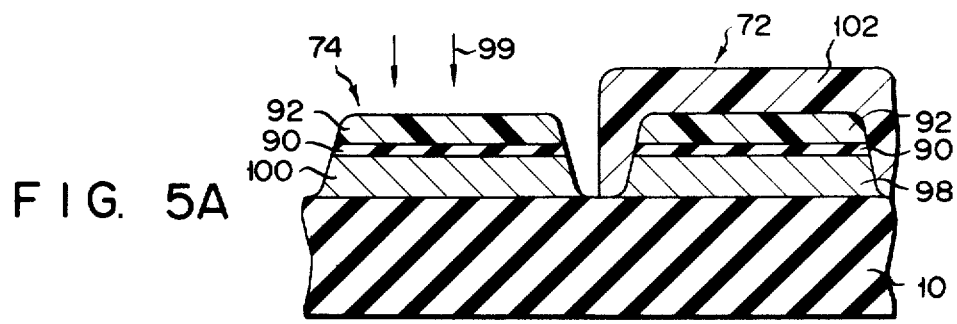
FIGS. 5A to 5D show main processes which are carried out after processes shown in FIGS. 4A to 4D and by which N-channel element and P-channel element are formed on the single insulating substrate.
Figure 5B:
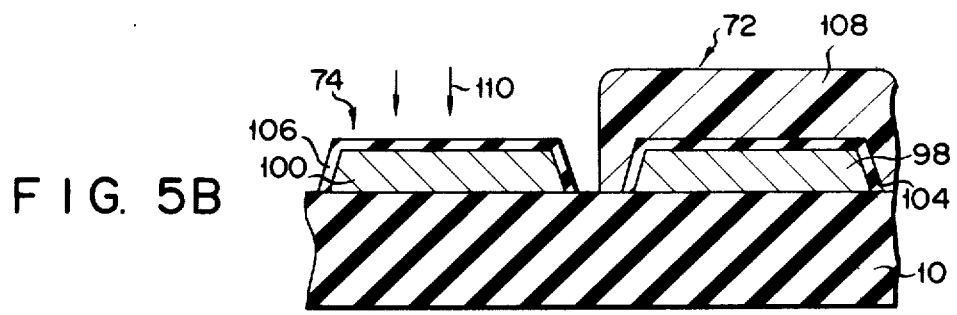
Figure 5C:
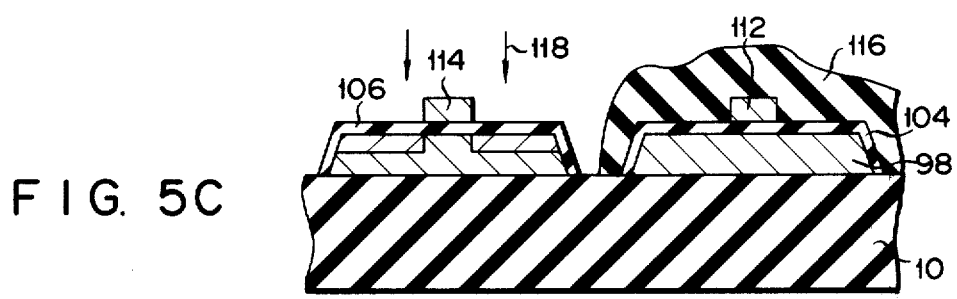
Figure 5D:
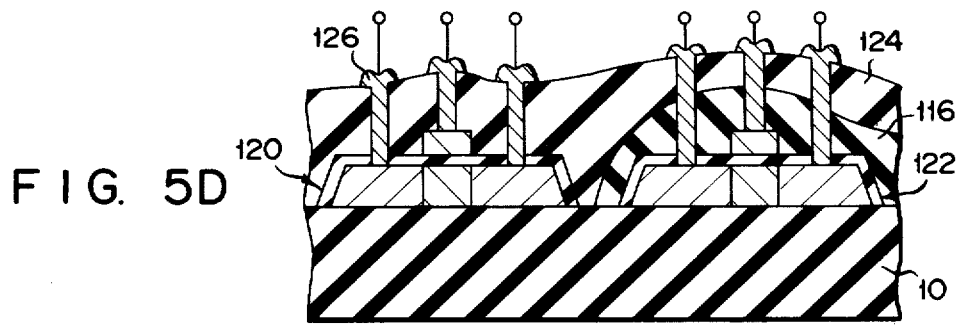

According to processes shown in FIGS. 5A to 5C, N- and P-channel elements are formed on the SOS wafer which is obtained after the finish of processes shown in FIGS. 4A to 4C. Thin heat-oxidized film 90 and CVD $SiO_2$ (or CVD polycrystal silicon) layer 92 are further formed on the single crystal silicon layer 86 (FIG. 4D) on the sapphire substrate 10, and the SOS wafer 88 is then chemically etched. As shown in FIG. 5A, a silicon layer 98 corresponding to the open area 72 in which N-channel elements are to be formed (hereinafter referred to as an N-channel element area) is separated from a silicon layer 100 corresponding to the mask area 74 in which P-channel elements are to be formed (hereinafter referred to as a P-channel element area). Ion implantation may be applied to silicon layers 98 and 100 before or after this separating process for the purpose of preventing an undesired parasitic MOS transistor from being formed at sides or the like of island-shaped silicon layers 98 and 100. A photoresist 102 is formed at the N-channel element area 72. Thereafter, phosphorus ions (P+) 99, for example, are implanted to the amount of $1 \times 10^{13}/cm^3$ at 50 KV into the P-channel element area 74. In the case of implanting boron ions (B+) to the amount of $1 \times 10^{13}/cm^3$ at 30 KV into the side of island-shaped silicon layer 98 at the N-channel element area 72, a photoresist (not shown) is formed at the P-channel element area 74. Heat-oxidized film 90 and CVD SiO$_2$ layer 92 are then removed. Oxide films 104 and 106 are respectively formed according to the process shown in FIG. 5B on the surface of each of island-shaped silicon layers 98 and 100 at N- and P-channel element areas 72 and 74. These oxide films 104 and 106 are formed to have a thickness of about 800 Å using dry oxygen (O$_2$). With the P-channel element area 74 being coated by a photoresist (not shown), boron ions (B+), for example, are implanted into the N-channel element area 72. Ion dose and acceleration voltage are set this time in such a way that the threshold voltage of N-channel elements becomes +1V. After the photoresist is removed, the N-channel element area 72 is coated by a photoresist 108 while P+110 are implanted into the P-channel element area 74. The threshold voltage of P-channel elements is controlled to be −1V this time. In FIG. 5C, polycrystal silicon layers 112 and 114 each about 3,500 Å thick are formed at channel element areas 72 and 74, respectively, by the well-known CVD process using the thermo-decomposition of silane (SiH$_4$). Island-shaped silicon layer 98 of N-channel element area 72, oxide film 104 and polycrystal silicon layer 112 are coated by a phosphor-doped SiO$_2$ (PSG) layer 116, boron ions (B+) 118 are injected into the P-channel element area 74. Namely, boron ions are injected to the amount of $1 \times 10^{\neq}/cm^3$ at 30 KV into source, drain and polycrystal silicon layer 114 of P-channel element area 74 to form a P-channel MOS transistor 120 (FIG. 5D). After heat treatment, phosphorus in the SiO$_2$ (PSG) layer 116 is doped into source and drain of island-shaped silicon layer 98 and into the polycrystal silicon layer 112 at the N-channel element area 72 to thereby form an N-channel MOS transistor 122 (FIG. 5D). An SiO$_2$ layer 124 is then formed, as shown in FIG. 5D, by the well-known CVD process on N- and P-channel MOS transisors 120 and 122. Finally, aluminium electrodes 126, . . . are formed by the well-known manner and wired with one another in each of transistors.

Figure 6A:
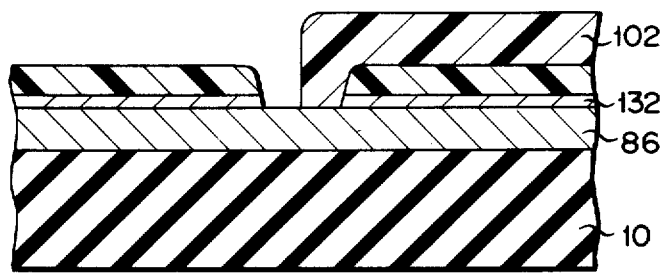
FIGS. 6A to 6D show other main processes corresponding to those shown in FIGS. 5A to 5D.
Figure 6B:
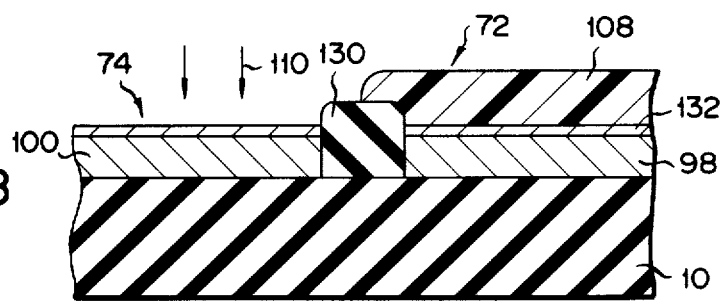
Figure 6C:
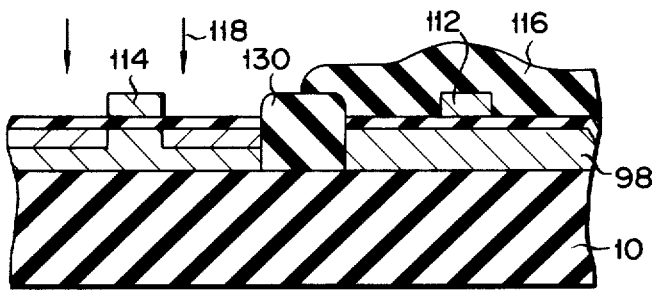
Figure 6D:
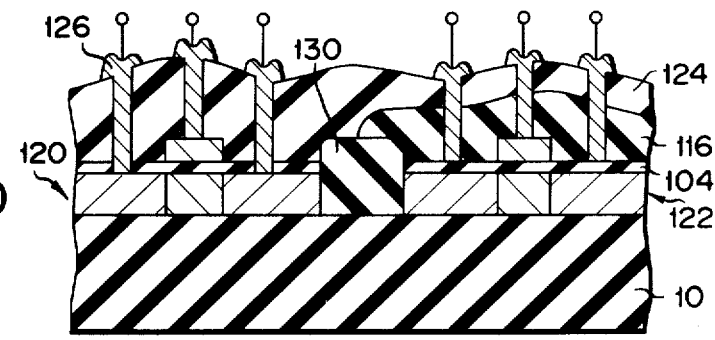

In addition to the element separating process shown in FIG. 5A, there is another process in which N- and P-channel element areas 72 and 74 are separated from each other by a separating insulation layer 130. As shown in FIGS. 6A and 6B, an oxidation-proof film 132, which is made of, for example platinum (Pt), alumina (Al$_2$O$_3$) or silicon nitride (SiN), is directly formed on the silicon layer 86 at each of element areas 72 and 74 or formed on the silicon layer 86 through a thin oxide film (not shown). The separating layer 130 is formed by oxidation between element areas 72 and 74 to the extent of reaching the sapphire substrate 10. Processes shown in FIGS. 6C and 6D are same as those shown in FIGS. 5C and 5D.

Figure 7A:
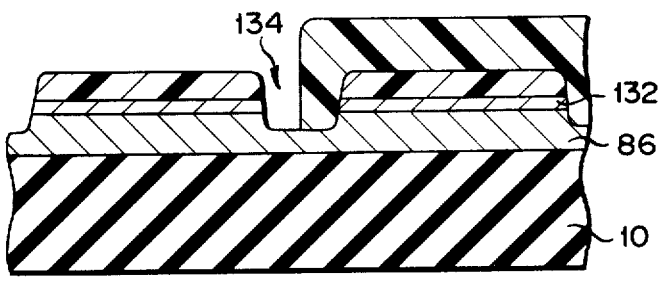
FIGS. 7A to 7D show further main processes corresponding to those shown in FIGS. 5A to 5D.
Figure 7B:
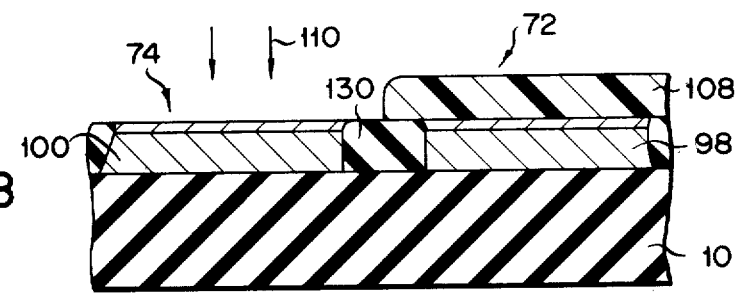
Figure 7C:
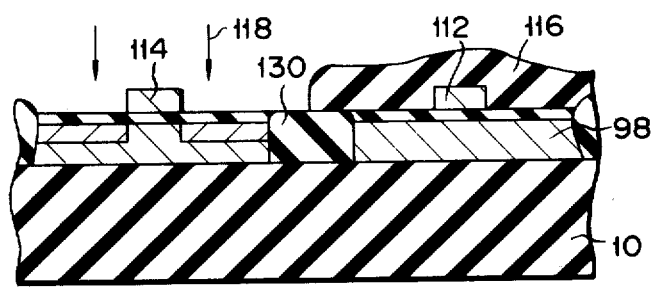
Figure 7D:
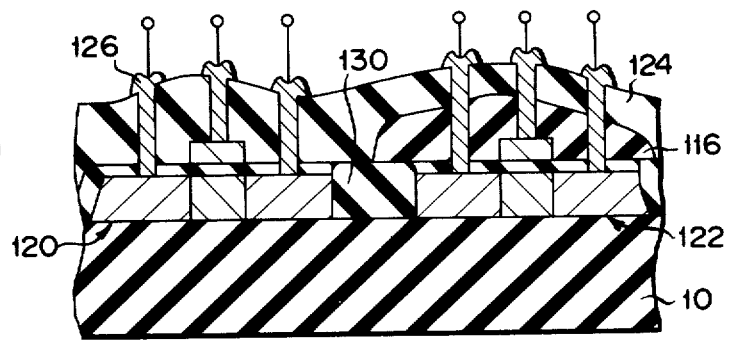

As shown in FIGS. 7A and 7B, two kinds of separating processes as described above may be combined with each other. After the oxidation-proof film 132 is formed on the silicon layer 86 in the process shown in FIG. 7A, a region 134 of silicon layer corresponding to the boundary portion between element areas 72 and 74 is removed by etching to form a recess whose depth is 3,000 Å, for example, from the surface thereof. The separating insulation layer 130 shown in FIG. 7B is then formed in this region 134 by a process same as that of FIG. 6B. Processes shown in FIGS. 7C and 7D are same as those shown in FIGS. 5C and 5D and therefore, detailed description about them is omitted.

N-channel MOS transistor 104 and P-channel MOS transistor 106 thus formed on the single sapphire substrate 10 are combined to form a CMOS inverter. Channel length and width of N-channel MOS transistor 106 of this CMOS. inverter are respectively set to 6 μm and 4.5 μm, respectively. Delay time measured by the ring oscillator per every one stage of CMOS inverter is about 1.5 nsec, which corresponds to that in a CMOS inverter formed on the conventional SOS wafer whose channel length and width are 6 μm and 8 μm, respectively.

According to the second embodiment of the present invention as described above, the amorphous portion 76 is formed only at the desired area on the sapphire substrate 10 or the area where N-channel elements are to be formed. This amorphous portion 76 grows in solid phase by heat treatment to form the single crystal silicon layer 86 as described above. Therefore, no compressive that is tensile stress is caused in the silicon layer corresponding to the N-channel element area 72 to thereby enhance electron mobility in this silicon layer. This electron mobility can be freely controlled by changing the difference between the inside temperature of furnace 24 in the heat treatment process of amorphous portion 76 and the temperature of cooling table 32 for cooling the sapphire substrate 10. On the other hand, the hole mobility of silicon layer corresponding to the P-channel element area 74 is not effected by processes as described above and the operation speed of formed P-channel MOS transistor 120 is not reduced. Therefore, a large carrier mobility can be obtained and any kind of MOS transistors can be easily formed on the single sapphire substrate 10, thus allowing complementary MOS (CMOS) devices of SOS structure to be easily manufactured. In addition, when the carrier mobility of elements may be as large as the conventional one, elements can be smaller-sized to allow CMOS devices of high integration to be easily provided.

Although the present invention has been shown and described with respect to particular embodiments, various changes and modifications obvious to a person skilled in the art to which the present invention pertains are deemed to lie within the spirit, scope and contemplation of the present invention. Though the amorphous portion has been formed at room temperature by ion implantation in the single crystal silicon layer in the case of above-mentioned embodiments, channelling ion injection of silicon ions (Si+) may be employed keeping the SOS wafer at 77° K., for example. Radiation of energy beam may be employed at the time of heating the SOS wafer after the formation of amorphous portion. The SOS wafer is fixedly bonded onto the cooling table which is held at $-20°$ C. and radiated by a laser beam, which is argon (Ar) laser of 10 W, for example. Argon laser beam is focussed through a lens to about 120 μϕ, moved at the speed of about 1 cm/sec on the surface of silicon layer, and moved in the lateral direction with every movement of 10 μm. The field-effect mobility $\mu_{fe}$ of N-channel MOS transistor on the SOS wafer which is formed by heat treatment of laser beam is further improved to be 1,300 cm²/V.sec.

Ions injected into the single crystal silicon layer to form the amorphous portion are not limited to silicon ions (Si+) but may be selected from other elements of IV group. Similarly, the silicon layer may be of N-type or of P-type. It is therefore freely selected whether the silicon layer on which N-channel elements are to be formed has the conductivity of P-type or N-type. Further, this silicon layer may be formed by GaP instead of silicon material and heat treatment may be carried out using pulse or continuous electron beam which is arranged to allow the amorphous portion to grow in solid phase. To add more words, it is unnecessary that the SOS wafer is cooled in the case where radiation of CW Ar laser and of CW electron beam of 20 KV and 3 mA is applied to the SOS wafer after the formation of amorphous portion, and the SOS wafer is arranged on a copper block which has a large heat capacity. The lattice constant of single crystal silicon layer in the SOS wafer which is obtained causing the amorphous portion to grow in solid phase as described above is 5.433 Å. The delay time of CMOS inverter which is comprised of N-channel transistor formed according to above-mentioned process and having a channel width of 5 μm was measured to be 1.5 nsec.

What is claimed is:

1. A method for manufacturing a semiconductor device having a semiconductive layer such as a silicon layer on a substrate made of electrically insulative material such as sapphire, which comprises the steps of:
   (a) forming a layer of single-crystalline semiconductive material such as silicon on a surface, which is defined by a first crystal plane, or said substrate having a first thermal expansion rate, said layer having a second thermal expansion rate and a second crystal plane as its principal plane;
   (b) injecting selected ions into said layer to partially convert the single-crystalline semiconductive material into a first layer region which is a amorphous semiconductive material and a second region which remains a single-crytalline semiconductive material, said first layer region being positioned below said second layer region and being substantially in contact with said substrate, and said second layer region including a surface of said layer and having a predetermined thickness;
   (c) annealing a structure obtained through the preceding steps to reconvert said amorphous material of said first layer region to single-crystalline semiconductive material on the basis of solid phase growth with said second layer region as a seed, while keeping said first and second layer regions of said layer at a first temperature and at least a large part of said substrate at a second temperature lower than said first temperature, so as to finally form a single-crystalline semiconductive layer on said substrate, whereby, when said annealed structure returns to room temperature, said single-crystalline semiconductive layer is prevented from having therein a compressive stress due to thermal contraction of said substrate.

2. A method for manufacturing a semiconductor device according to claim 1, wherein the insulating substrate is fixed on a cooling means arranged in a furnace and kept at the second temperature by the cooling means while the single crystal semiconductor layer and amorphous portion on this insulating substrate are kept at the first temperature by the furnace.

3. The method according to claim 1, wherein said annealing step comprises:
   a step of keeping a first substrate region which is distinct from a second substrate region at said first temperature and of keeping the second substrate region at said second temperature, said second substrate region including the surface of said substrate, having a predetermined thickness and being positioned on said first substrate region.

4. The method according to claim 1, wherein said second temperature is so selected that said thermal contraction of said substrate is smaller than thermal contraction of said single-crystalline semiconductive layer when said annealed structure returns to room temperature, whereby said single-crystalline semiconductive layer has a tensile stress of predetermined strength acting substantially toward said second crystal plane.

5. The method according to claim 3, wherein said thickness of said second substrate region is preferably several microns.

6. A method for manufacturing a semiconductor device according to claim 2, wherein the cooling means includes a cooling table and a cooling pipe which is provided in the cooling table and through which cooling gas flows, and the insulating substrate is bonded onto the cooling table with a predetermined material.

7. A method for manufacturing a semiconductor device according to claim 6, wherein said material is having a low melting point.

8. A method for manufacturing a semiconductor device according to claim 6, wherein the second temperature of the insulating substrate fixed on the cooling table is changed by controlling the amount of cooling gas flowing through the cooling pipe.

9. A method for manufacturing a semiconductor device having a silicon layer on a sapphire substrate, which comprises the steps of:
   (a) forming a layer of single-crystalline silicon on a surface of said substrate having a first thermal expansion rate, said layer having a surface and a second thermal expansion rate, and said substrate surface including first and second surface areas adjacent to each other;
   (b) converting a first portion of said single-crystalline silicon layer, positioned on the first surface area of said substrate, into a first layer region which is amorphous silicon and a second layer region which remains single-crystalline silicon, said first layer region being positioned below said second layer region and said second layer region including the surface of said layer and having a predetermined thickness;
   (c) converting a second portion of said single-crystalline silicon of another layer section, position on the second surface area of said substrate, into a third layer region which is amorphous silicon and a fourth layer region which remains single-crystalline silicon, said third layer region including the surface of said layer and having a predetermined thickness and said fourth layer region being positioned below said third layer region;

(d) annealing a structure obtained through the preceding steps to reconvert said first and third layer regions of amorphous silicon into single-crystalline regions on the basis of solid state growth with single-crystalline silicon of each of said second and fourth layer regions as a seed, while keeping said silicon layer at a first temperature and at least a large part of said sapphire substrate at a second temperature lower than said first temperature, so as to finally form a first and second single-crystalline silicon layers which are adjacent to each other on said substrate; and (e) forming on said first single-crystalline silicon layer at least one first active semiconductor element which functions by substantially using as the majority carrier thereof and forming on said single-crystalline silicon layer at least one second active semiconductor element which functions by substantially using holes as the majority carrier thereof.

10. The method according to claim 5, wherein said thickness of said second substrate region is preferably over at least 20 Å.

11. The method according to claim 10, wherein said first crystal plane of said layer is (1012).

12. The method according to claim 11, wherein said second crystal plane of said layer is (100).

13. The method according to claim 12, wherein said ions to be injected into said first layer region in said step (b) include at least ions of elements of Group IV.

* * * * *